US012632081B2

(12) United States Patent
Lee et al.

(10) Patent No.: US 12,632,081 B2
(45) Date of Patent: May 19, 2026

(54) DISPLAY APPARATUS

(71) Applicant: LG Display Co., Ltd., Seoul (KR)

(72) Inventors: Junjae Lee, Paju-si (KR); Chanhyeok Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 779 days.

(21) Appl. No.: 17/992,835

(22) Filed: Nov. 22, 2022

(65) Prior Publication Data

US 2023/0213964 A1 Jul. 6, 2023

(30) Foreign Application Priority Data

Dec. 30, 2021 (KR) ........................ 10-2021-0193276

(51) Int. Cl.
| | |
|---|---|
| *G06F 1/16* | (2006.01) |
| *H10K 59/00* | (2023.01) |
| *G09F 9/30* | (2006.01) |
| *H05K 1/189* | (2026.01) |

(52) U.S. Cl.
CPC .......... *G06F 1/1601* (2013.01); *G06F 1/1637* (2013.01); *H10K 59/00* (2023.02); *G09F 9/301* (2013.01); *H05K 1/189* (2013.01); *H05K 2201/0116* (2013.01)

(58) Field of Classification Search
CPC ...... G06F 1/1601; G06F 1/1637; G09F 9/301; H10K 1/189; H10K 2201/0116; H10K 59/00
USPC ......................................................... 428/1.6
See application file for complete search history.

(56) References Cited

U.S. PATENT DOCUMENTS

| | | | | |
|---|---|---|---|---|
| 5,726,672 | A | * | 3/1998 | Hernandez .......... G06F 3/04897 |
| | | | | 348/189 |
| 9,004,736 | B1 | | 4/2015 | Srinivas et al. |
| 10,344,188 | B2 | | 7/2019 | Janoski et al. |
| 11,515,503 | B2 | | 11/2022 | Shin et al. |
| 2018/0346762 | A1 | | 12/2018 | Janoski et al. |
| 2021/0175462 | A1 | | 6/2021 | Shin et al. |

FOREIGN PATENT DOCUMENTS

| | | | |
|---|---|---|---|
| JP | 2015187977 A | * | 10/2015 |
| JP | 2018-169523 A | | 11/2018 |
| KR | 10-2018-0108599 A | | 10/2018 |
| KR | 10-2021-0069830 A | | 6/2021 |

OTHER PUBLICATIONS

Korean Intellectual Property Office, Office Action, Korean Patent Application No. 10-2021-0193276, Dec. 8, 2024, 10 pages.
China National Intellectual Property Administration, Office Action, Chinese Patent Application No. 202211334613.X, Dec. 13, 2025, 20 pages.

* cited by examiner

*Primary Examiner* — Ruiyun Zhang
(74) *Attorney, Agent, or Firm* — Fenwick & West LLP

(57) ABSTRACT

A display apparatus includes a cover member, a display panel disposed on a back surface of the cover member, a cushion plate disposed on a back surface of the display panel, and a through-hole extending through the cushion plate, the cushion plate includes a porous member and a metal coating layer disposed on a back surface of the porous member, and the metal coating layer contains nickel (Ni) and has a thickness in a range from 0.2 μm to 0.5 μm.

10 Claims, 15 Drawing Sheets

A 321 323
320

| | SCI | | | SCE | | |
|---|---|---|---|---|---|---|
| | L*(D65) | a*(D65) | b*(D65) | L*(D65) | a*(D65) | b*(D65) |
| FIRST EXAMPLE | 53.59 | 1.66 | 5.93 | 52.94 | 1.7 | 6.03 |
| SECOND EXAMPLE | 53.33 | 1.68 | 6.01 | 52.75 | 1.69 | 6.12 |
| THIRD EXAMPLE | 53.33 | 1.74 | 6.14 | 52.67 | 1.75 | 6.22 |
| FOURTH EXAMPLE | 52.78 | 1.7 | 6.01 | 51.12 | 1.65 | 5.92 |
| FIFTH EXAMPLE | 53.08 | 1.71 | 5.91 | 51.32 | 1.66 | 5.83 |
| SIXTH EXAMPLE | 52.47 | 1.77 | 6.18 | 51.01 | 1.7 | 6.02 |

FIG. 7

WHITE SPOT

DISPLAY APPARATUS

CROSS-REFERENCE TO RELATED APPLICATION

This application claims priority from Korean Patent Application No. 10-2021-0193276 filed on Dec. 30, 2021 in the Korean Intellectual Property Office, and all the benefits accruing therefrom under 35 U.S.C. 119, the contents of which in its entirety are herein incorporated by reference.

BACKGROUND

Field

The present disclosure relates to a display apparatus including a through-hole in a display area, and more specifically, is to provide a display apparatus that may reduce an occurrence of mura near the through-hole and improve visibility of a front surface thereof.

Description of Related Art

Display apparatuses are implemented in a variety of forms, such as a television, a monitor, a smart phone, a tablet PC, a laptop computer, and a wearable device.

The display apparatus may generally include a display area for displaying a screen and a non-display area formed along an outer edge of the display area.

The non-display area is also referred to as a bezel area. When the bezel area is thick, a user's gaze is dispersed, but when the bezel area is thin, the user's gaze is fixed on a screen of the display area, so that a degree of immersion may be increased.

In one example, recent display apparatuses dispose various components such as a camera module and various sensor modules on a front surface thereof where the display area exists.

In this case, the area in which various components are disposed as described above may be the non-display area, and an increase in the non-display area may result in a decrease in the degree of immersion of the user.

SUMMARY

In order to minimize an increase of a non-display area due to various components disposed on a front surface of a display apparatus, a hole may be defined in a display area and the components may be inserted into the hole.

As such, as the various components are inserted into the hole defined in the display area, not the non-display area, a decrease in the display area may be minimized without increasing the non-display area as much as possible, so that a degree of immersion of a user may be increased.

However, due to the hole defined in the display area, a difference in light and shade resulting from a difference in light transmittance may occur between the area in which the hole is defined and an area in which the hole is not defined.

Accordingly, due to a color difference between the area in which the hole is defined and the area in which the hole is not defined, a change in an element causing a change in a screen color of the display apparatus may occur.

The change in the element in the display apparatus eventually causes a mura phenomenon around the area in which the hole is defined.

Further, various layers may be stacked and formed inside the display apparatus. When various layers having different colors with distinct differences in light and shade are stacked, visibility may be deteriorated due to a difference in luminous reflectance on the front surface of the display apparatus.

Accordingly, the inventors of the present disclosure have invented the display apparatus including the through-hole inside the display area capable of reducing the occurrence of mura near the through-hole and improving the visibility of the front surface of the display apparatus.

A purpose according to one embodiment of the present disclosure is to provide a display apparatus that may reduce an occurrence of mura in the vicinity of a through-hole.

A purpose according to one embodiment of the present disclosure is to provide a display apparatus that may improve front surface visibility.

Purposes of the present disclosure are not limited to the above-mentioned purpose. Other purposes and advantages of the present disclosure that are not mentioned may be understood based on following descriptions, and may be more clearly understood based on embodiments of the present disclosure. Further, it will be easily understood that the purposes and advantages of the present disclosure may be realized using means shown in the claims and combinations thereof.

A display apparatus according to an embodiment of the present disclosure includes a cover member, a display panel disposed on a back surface of the cover member, a cushion plate disposed on a back surface of the display panel, and a through-hole extending through the cushion plate.

In this case, the cushion plate includes a porous member and a metal coating layer disposed on a back surface of the porous member, and the metal coating layer contains nickel (Ni) and has a thickness in a range from 0.2 μm to 0.5 μm.

A display apparatus according to another embodiment of the present disclosure includes a cover member; a first connecting member disposed under the cover member; a display panel disposed under the first connecting member; a first plate disposed under the display panel; a cushion plate disposed under the first plate; and a through-hole extending through the cushion plate, the first plate, the display panel and the first connecting member, wherein the cushion plate includes a porous member, a metal coating layer disposed on a back surface of the porous member and the adhesive member disposed between the porous member and the first plate, wherein the metal coating layer contains nickel and has a thickness in a range from 0.2 μm to 0.5 μm, and wherein the metal coating layer and the adhesive member each has a gray-based color.

Because the cushion plate including the porous member includes the metal coating layer on the back surface of the porous member and the metal coating layer contains the nickel (Ni) and has the thickness in the range from 0.2 μm to 0.5 μm, the display apparatus according to an embodiment of the present disclosure may realize the gray-based color.

Accordingly, the occurrence of the mura phenomenon in the vicinity of the through-hole may be greatly reduced.

Further, because the cushion plate includes the porous member and the metal coating layer having the gray-based color as described above and the monochromatic cushion plate is disposed to correspond to the front surface of the display area, the display apparatus according to an embodiment of the present disclosure may improve luminous reflectance on the front surface thereof to greatly improve front surface visibility.

Effects of the present disclosure are not limited to the above-mentioned effects, and other effects as not mentioned will be clearly understood by those skilled in the art from following descriptions.

BRIEF DESCRIPTION OF DRAWINGS

FIG. 7 is a table summarizing result values obtained by measuring L*, a*, b* color coordinates according to various Examples of the present disclosure.

DETAILED DESCRIPTIONS

Figure 1A:
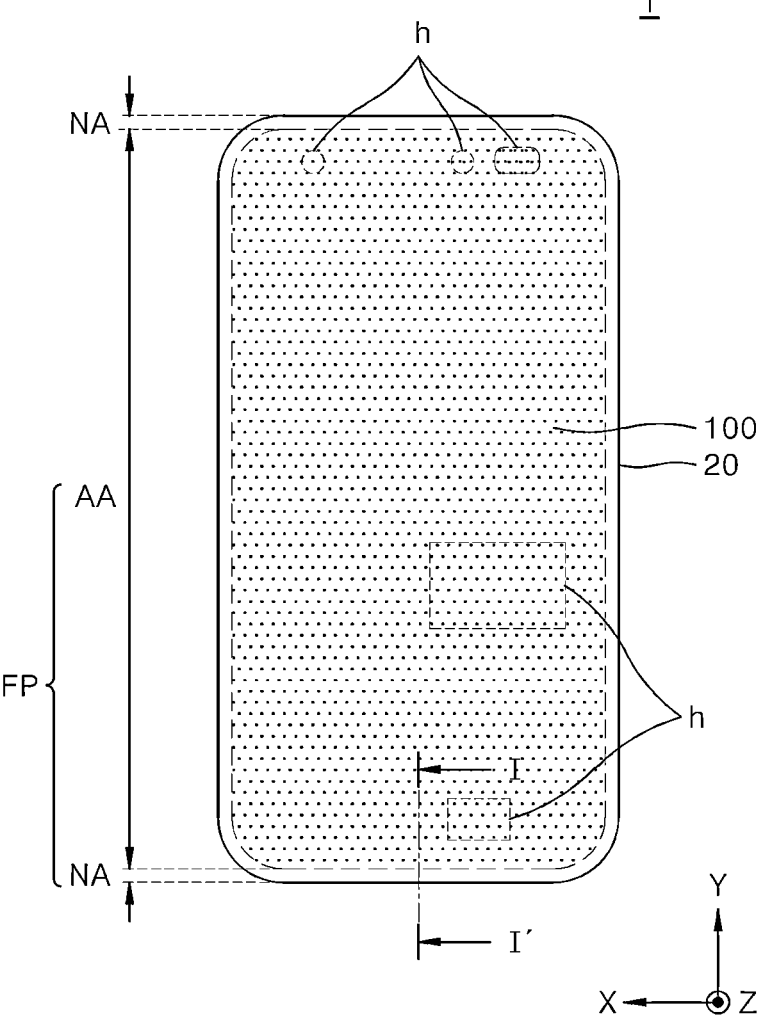
FIGS. 1A and 1C show a front surface and a back surface, respectively, of a display apparatus according to one embodiment of the present disclosure.

Advantages and features of the present disclosure, and a method of achieving the advantages and features will become apparent with reference to embodiments described later in detail together with the accompanying drawings. However, the present disclosure is not limited to the embodiments as disclosed below, but may be implemented in various different forms. Thus, these embodiments are set forth only to make the present disclosure complete, and to completely inform the scope of the present disclosure to those of ordinary skill in the technical field to which the present disclosure belongs, and the present disclosure is only defined by the scope of the claims.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough under-standing of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subse-quent" or "directly before" is not indicated.

It will be understood that, although the terms "first", "second", "third", and so on may be used herein to describe various elements, components, regions, layers and/or sec-tions, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is a separate explicit description thereof.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

The features of the various embodiments of the present disclosure may be partially or entirely combined with each other, and may be technically associated with each other or operate with each other. The embodiments may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A display apparatus of the present disclosure may be applied to an organic light-emitting display apparatus, but may not be limited thereto, and may be applied to various display apparatuses such as a micro LED display apparatus or a quantum dot display apparatus.

Hereinafter, with reference to the drawings, the display apparatus according to an embodiment of the present disclosure will be described in detail.

Figure 1B:
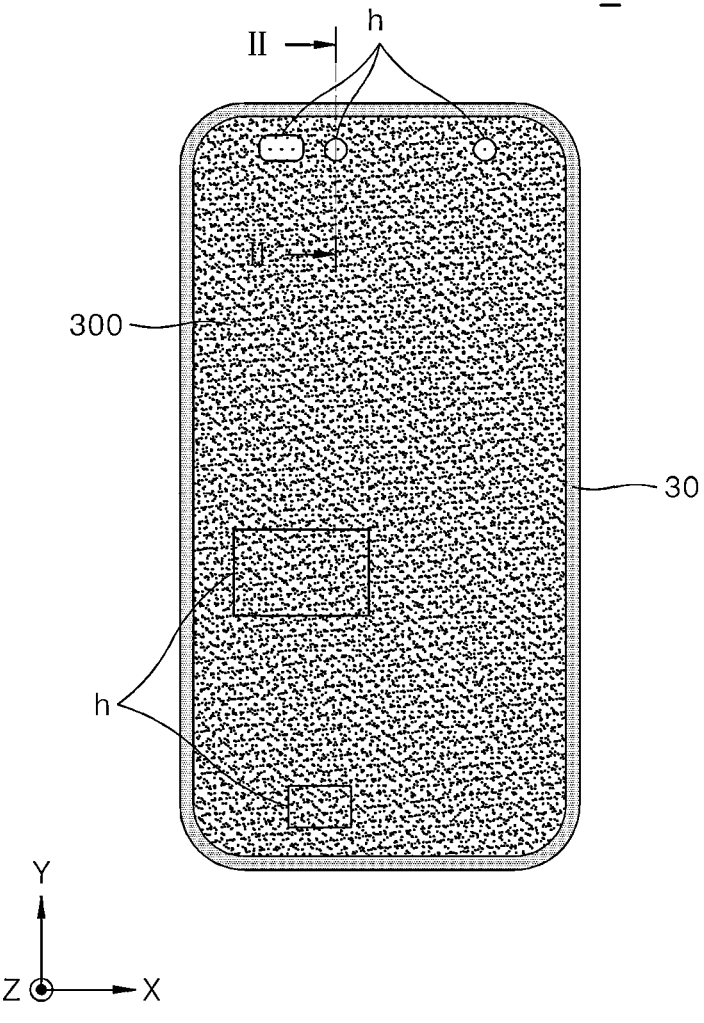
FIG. 1B shows a back surface of a display apparatus with a casing removed.
Figure 1C:
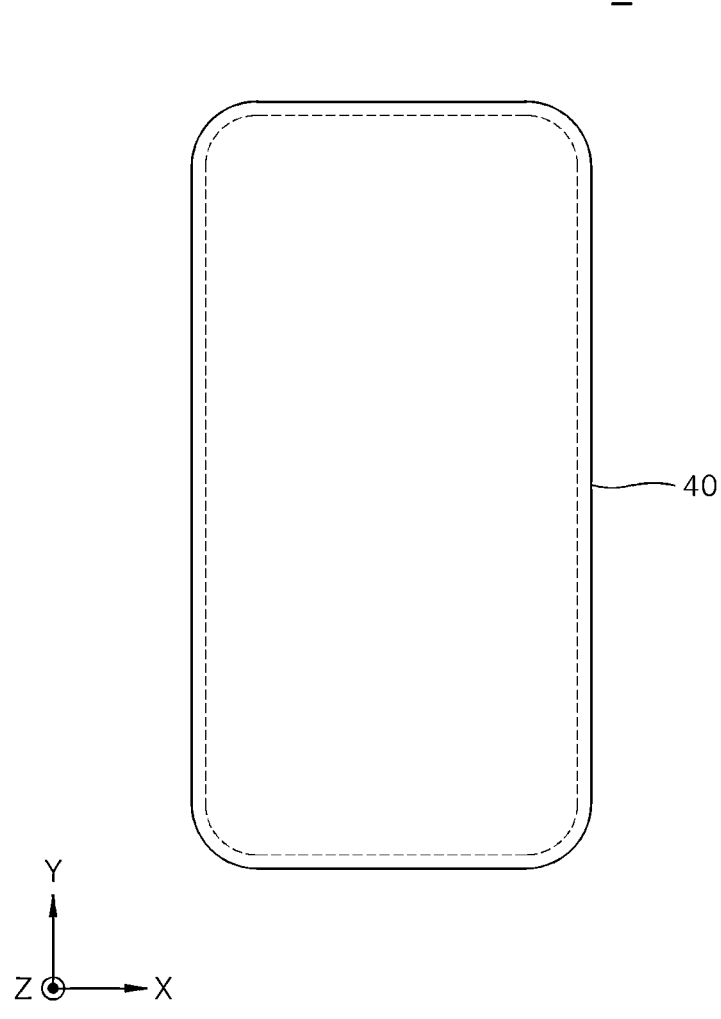

FIGS. 1A and 1C show a front surface and a back surface, respectively, of a display apparatus according to one embodiment of the present disclosure, and FIG. 1B shows a back surface of a display apparatus with a casing removed.

A direction of a front surface and an upward direction defined in the present disclosure mean a Z-axis direction, and a direction of a back surface and a downward direction mean a −Z-axis direction.

A display apparatus 1 may include a cover member 20 and a display panel 100 attached to a back surface (directed in the −Z-axis direction) of the cover member 20.

The cover member 20 may cover a front surface of the display apparatus 1 to protect the display apparatus 1 from external impact.

An edge of the cover member 20 may have a curvature portion or a curved portion that is bent in a direction of a back surface of the display apparatus 1.

Because the cover member 20 may be disposed to cover up to side surfaces of the display apparatus 1 disposed on a back surface thereof, the cover member 20 may protect the display panel 100 from external impact not only on the front surface but also on side surfaces of the display apparatus 1.

The cover member 20 may overlap a display area AA for displaying an image. For example, the cover member 20 may be formed as a cover glass made of a transparent plastic material or a transparent glass material that may transmit the image, but the present disclosure may not be limited thereto.

A casing 40 for supporting the cover member 20 may be disposed on a back surface of the display apparatus 1.

The casing 40 may serve as a housing that protects the back surface of the display apparatus 1 to function as an outermost shell of the display apparatus 1.

The casing 40 may be made of various materials such as plastic, metal, or glass.

A middle frame 30 may be additionally disposed between the cover member 20 and the casing 40.

The middle frame 30 may accommodate the display panel 100 therein, and one end of the middle frame 30 may be in contact with the cover member 20 to support the cover member 20.

The middle frame 30 may serve as a housing that protects a rear surface of the display panel 100.

The middle frame 30 may have a structure of accommodating therein the display panel 100 and additional components such as a battery that is disposed on the back surface of the display panel 100 and applies power to drive the display apparatus 1, but the structure may not be particularly limited.

For example, the middle frame 30 may cover the back surface of the display panel 100 to have a structure of accommodating therein the display panel 100 in a direction of one surface of the middle frame 30 and accommodating therein the additional components such as the battery in a direction of the other surface of the middle frame 30.

Further, the middle frame 30 may be formed to cover a portion of the back surface of the display panel 100 to have a structure of accommodating therein the display panel 100 and the additional components such as the battery to be in contact with each other without dividing sections.

A front surface FP of the display panel 100 may be disposed beneath the cover member 20.

On the front surface FP, a pixel array including a pixel having a plurality of light-emitting elements and a driving transistor, and a signal wiring for transmitting a driving signal to the pixel is disposed, so that the image may be displayed.

The front surface FP may include a display area (an active area, AA) in which the image is displayed and a non-display area (non-active area, NA) other than the display area AA. The non-display area NA may be formed at an edge surrounding the display area AA.

The display area AA and the non-display area NA may be equally applied to the cover member 20.

An area through which the image is transmitted in the cover member 20 may be the display area AA.

An area surrounding the display area AA and through which the image is not transmitted may be the non-display area NA.

The non-display area NA may be defined as a bezel area.

Referring to FIG. 1B, a cushion plate 300 may be disposed on the back surface of the display panel 100.

The cushion plate 300 may have a gray-based color and may be monochromatic.

The monochromatic cushion plate 300 may be disposed to correspond to an entire area of the display area AA. Accordingly, it is possible to greatly improve front surface visibility by improving a luminous reflectance on the front surface of the display apparatus 1.

Further, at least one through-hole h may be defined in the display area AA.

Referring to FIGS. 1A and 1B, the through-hole h may be defined at an upper end of the display apparatus 1 and near a central area of the display apparatus 1, but the present disclosure may not be limited thereto. The number and locations of through-holes may vary depending on a design direction of the display apparatus 1.

Various recognition sensors, such as a fingerprint sensor, an infrared sensor, a camera sensor, and the like may be inserted and disposed in the through-hole h.

As such, according to an embodiment of the present disclosure, because the various recognition sensors are not disposed in the separate non-display area NA, but are inserted into the through-hole h disposed in the display area AA, which is a hole-in-display (HID) structure, a degree of immersion of a user may be increased by minimizing a decrease in the display area AA without increasing the non-display area NA.

The display panel 100 disposed beneath the cover member 20 may include a bendable portion that extends from one end of the front surface FP and is bent in the downward direction.

The bendable portion may be disposed at an outermost portion of the display panel 100 and may be easily exposed to the external impact, and may be easily deformed or damaged when the impact is applied thereto. Accordingly, it is possible to absorb the impact by adding a support member or a reinforcing member for protecting the bendable portion.

Hereinafter, a structure of the display apparatus 1 according to an embodiment of the present disclosure will be described.

Figure 2:
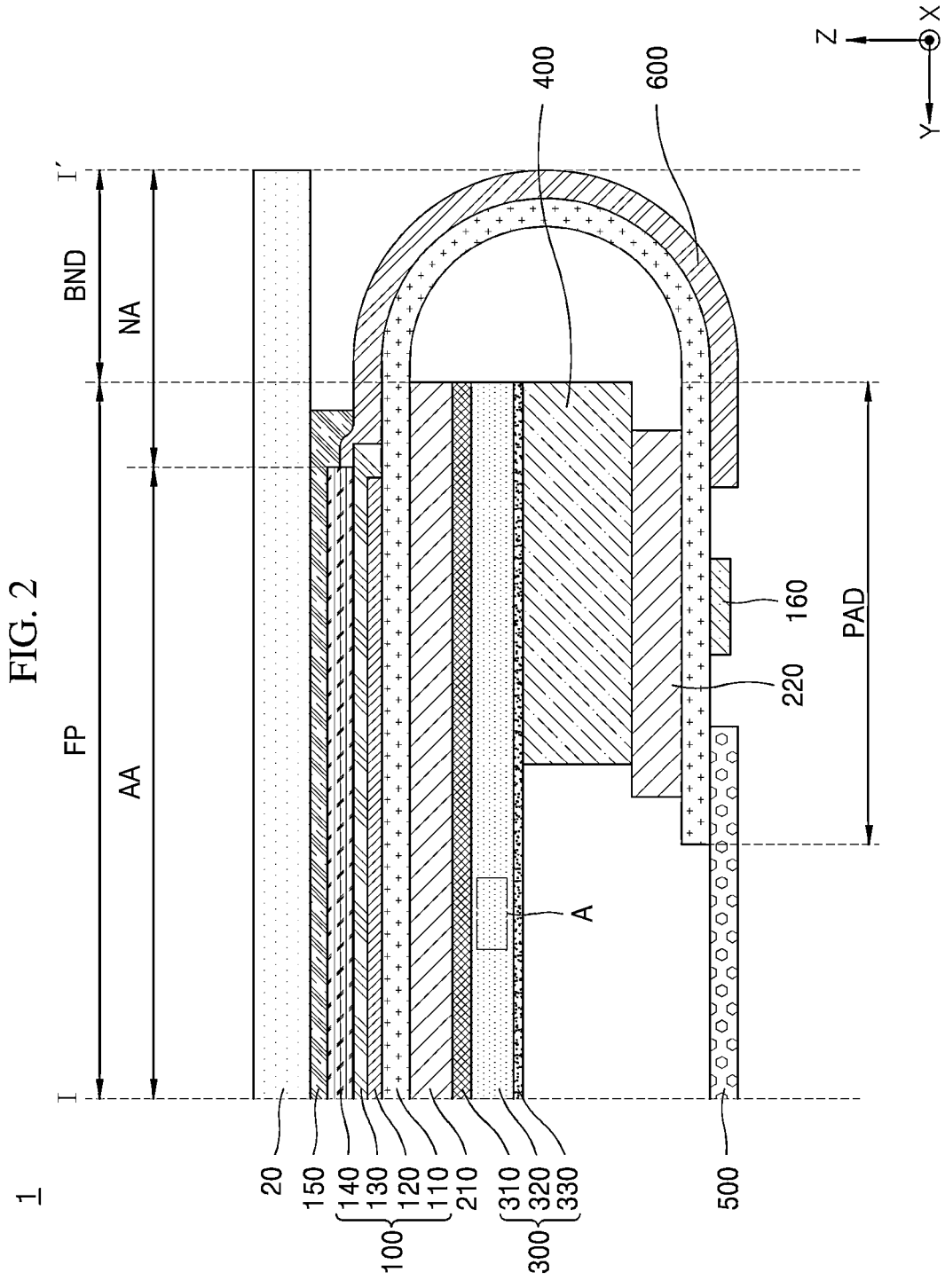
FIG. 2 is a cross-sectional view taken along a line I-I' of a display apparatus according to an embodiment of the present disclosure.

FIG. 2 is a cross-sectional view taken along a line I-I' of the display apparatus 1 according to an embodiment of the present disclosure.

The display apparatus 1 may include the cover member 20 positioned at an uppermost portion and the display panel 100 disposed below the cover member 20.

The display apparatus 1 may include the display panel 100 including a front surface FP, a bendable portion BND, and a pad PAD bent from the bendable portion BND and positioned in the rear of the front surface FP, the cushion plate 300 disposed between the front surface FP and the pad PAD, and a second connecting member 400 that fixes the pad PAD to the cushion plate 300.

A first plate 210, the cushion plate 300, the second connecting member 400, a second plate 220, and the pad PAD may be sequentially disposed beneath the front surface FP of the display panel 100.

A first connecting member 150 may be disposed between the cover member 20 and the display panel 100.

The first connecting member 150 may connect or couple the cover member 20 and the display panel 100 to each other.

For example, the first connecting member 150 may be a fixing member, and may not be limited by the terminology.

Because the first connecting member 150 may be disposed to overlap the display area AA, a material through which the image of the display panel 100 may be transmitted may be used.

For example, the first connecting member 150 may be made of a material such as an optical clear adhesive (OCA), an optical clear resin (OCR), or a pressure sensitive adhesive (PSA) or a material that may contain the same, but the present disclosure may not be limited thereto.

The display panel 100 disposed beneath the cover member 20 may include the front surface FP, the bendable portion BND, and the pad PAD based on a display substrate 110.

The front surface FP of the display panel 100 may be disposed beneath the first connecting member 150. For example, the front surface FP may be a portion where the image is displayed, and may include the display substrate 110, a pixel array 120, an encapsulation portion 130, and a polarizing plate 140.

The bendable portion BND of the display panel 100 may be a portion extending from one end of the front surface FP and bent in the downward (the −Z-axis) direction and then in a plane (Y-axis) direction again.

The bendable portion BND may include the display substrate 110 and the signal wiring.

The pad PAD of the display panel 100 may extend from the bendable portion BND, and may be disposed below the front surface FP.

The pad PAD may include the display substrate 110, the signal wiring, and a pad electrode connected to the signal wiring. A driver circuit or a flexible circuit board for driving the pixel may be mounted on the pad electrode.

The display panel 100 may include the polarizing plate 140 disposed at a top of the front surface FP. In addition, a functional layer for improving a display performance of the display apparatus may be further disposed between the first connecting member 150 and the polarizing plate 140.

The polarizing plate 140 may increase outdoor visibility and contrast ratio for the image displayed on the display panel 100 by preventing reflection of external light.

The display panel 100 may include the display substrate 110, the pixel array 120 disposed on the display substrate 110, and the encapsulation portion 130 disposed to cover the pixel array 120.

The display substrate 110 may be disposed at a lowermost portion of the display panel 100.

The display substrate 110 may be formed in all of the front surface FP, the bendable portion BND, and the pad PAD.

The display substrate 110 may be made of a plastic material having flexibility to have a flexible characteristic.

The display substrate 110 may contain polyimide, and may be made of a thin glass material having flexibility.

The pixel array 120 may be disposed on the display substrate 110. The pixel array 120 may display the image. A portion in which the pixel array 120 is disposed may be the display area AA.

Accordingly, the area corresponding to the pixel array 120 with respect to the cover member 20 may be the display area AA, and an area other than the display area AA may be the non-display area NA.

The pixel array 120 may include the light-emitting element, the thin-film transistor for driving the light-emitting element, and the signal wirings including a gate line, a data line, and a pixel driving power line on the display substrate 110.

The pixel array 120 may include the pixel for displaying the image in response to signals supplied to the signal wirings, and the pixel may include the light-emitting element and the thin-film transistor.

The light-emitting element may include an anode electrode electrically connected to the thin-film transistor, a light-emitting layer formed on the anode electrode, and a cathode electrode for supplying a common voltage.

The thin-film transistor may include a gate electrode, a semiconductor layer, a source electrode, and a drain electrode.

The semiconductor layer of the thin-film transistor may contain silicon such as a-Si, poly-Si, or low-temperature poly-Si, or an oxide such as an indium-gallium-zinc-oxide (IGZO), but the present disclosure may not be limited thereto.

In each pixel area, the anode electrode may be disposed to correspond to an opening area defined based on a pattern shape of the pixel to be electrically connected to the thin-film transistor.

The light-emitting element may include the light-emitting layer formed between the anode electrode and the cathode electrode.

The light-emitting layer may be implemented to emit light of the same color, such as white light, for each pixel, or to emit light of a different color, such as red, green, or blue light, for each pixel.

The encapsulation portion 130 may be disposed on the display substrate 110 to cover the pixel array 120.

The encapsulation portion 130 may prevent penetration of oxygen, moisture, or foreign substances into the light-emitting layer of the pixel array 120.

The encapsulation portion 130 may be formed in a multi-layer structure in which an organic material layer and an inorganic material layer are alternately stacked, but present disclosure may not be limited thereto.

The front surface FP of the display panel 100 may include the display substrate 110, the pixel array 120, and the encapsulation portion 130, and may be formed in a planar state except for an edge.

The first plate 210 to be described later may be connected or coupled to a bottom of the front surface FP so as to maintain the planar state of the front surface FP.

In the bendable portion BND of the display panel 100, the pixel array 120, the encapsulation portion 130, and the first plate 210 to be described later may not be disposed, but the display substrate 110 may be disposed. The bendable portion BND may be a portion that may be easily bent in a direction desired by the user.

The pad PAD of the display panel 100 may be a portion in which the pixel array 120 and the encapsulation portion 130 are not disposed.

In order for the pad PAD to maintain a planar state, the second plate 220, which will be described later, may be connected or coupled to a bottom of the pad PAD.

Accordingly, the front surface FP of the display panel 100 may be directed in a direction in which a screen is displayed, and the pad PAD may be bent in the downward direction of the front surface FP from the bendable portion BND to be positioned downwardly of the front surface FP, that is, in the rear of the front surface FP.

The first plate 210 disposed beneath the front surface FP of the display panel 100 and the second plate 220 disposed beneath the pad PAD may be disposed beneath the display substrate 110 to remain the front surface FP in the planar shape while complementing rigidity of the display substrate 110.

The first plate 210 and the second plate 220 may have certain strengths and thicknesses to complement the rigidity of the display substrate 110, and may not be formed in a bendable portion BND area in which the bendable portion BND is disposed.

Based on a shape before the display panel 100 is bent, the first plate 210 and the second plate 220 may be disposed beneath the display substrate 110 and spaced apart from each other.

Based on a shape after the display panel 100 is bent, the first plate 210 may be disposed beneath the front surface FP and the second plate 220 may be disposed on top of the pad PAD.

The first plate 210 and the second plate 220 may be back plates disposed on the back surface of the display substrate 110.

The first plate 210 and the second plate 220 may be formed as a plastic thin-film having rigidity.

For example, the first plate 210 and the second plate 220 may be made of polyethylene terephthalate (PET), polyimide (PI), polyethylene naphthalate (PEN), and the like, but the present disclosure may not be limited thereto.

The first plate 210 and the second plate 220 may be made of the same material and may have the same thickness, but the present disclosure may not be limited thereto.

Based on the shape after the display panel 100 is bent, the cushion plate 300 may be disposed between the first plate 210 and the second plate 220.

The cushion plate 300 may be disposed beneath the first plate 210.

The cushion plate 300 may include an adhesive member 310, a porous member 320, and a metal coating layer 330. The porous member 320 may be a metal foam.

The porous member 320 may function as a cushion layer of the cushion plate 300, thereby alleviating impacts of various components that may come into contact with the cushion plate 300.

The porous member 320 having the impact alleviating function may reinforce rigidity of the cushion plate 300.

Figure 3:
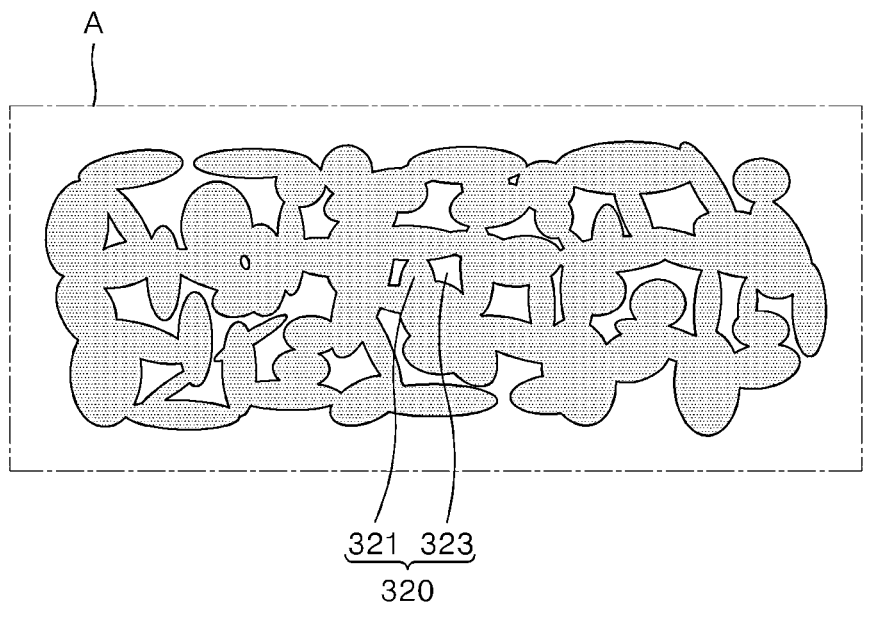
FIG. 3 is an enlarged cross-sectional view of a porous member according to an embodiment of the present disclosure.

Referring to FIG. 3, the porous member 320 may be a porous metal structure including a conductive metal 321 and a plurality of pores 323 positioned inside the conductive metal 321.

Because the conductive metal 321 of the porous member 320 is a metal with high thermal conductivity, the porous member 320 itself may provide an excellent heat-dissipation function. Because the porous member 320 has the metal structure having the plurality of pores 323 therein, the porous member 320 may also provide an excellent cushion function.

Further, because the porous member 320 includes the plurality of pores 323 inside the conductive metal 321, an overall surface area is increased, so that the porous member 320 itself may provide the excellent heat-dissipation function.

The porous member 320 may be formed by the following preparation method as an example, but the present disclosure may not be limited thereto.

The porous member 320 may be formed by sintering a metal foam precursor containing a metal powder.

The metal foam precursor refers to a structure before proceeding with a process, such as sintering, performed to form the porous member 320.

For example, the metal foam precursor may be formed using a slurry containing the metal powder, a dispersant, and a binder.

The metal powder may be a metal powder in which one or more of a copper powder, a nickel powder, an iron powder, a SUS powder, a molybdenum powder, a silver powder, a platinum powder, a gold powder, an aluminum powder, a chromium powder, an indium powder, a tin powder, a magnesium powder, a phosphorus powder, a zinc powder, and a manganese powder are mixed with each other, or an alloy powder of one or more metals, but the present disclosure may not be limited thereto.

In one example, alcohol may be used as the dispersant, but the present disclosure may not be limited thereto.

In this case, as the alcohol, monohydric alcohol having 1 to 20 carbon atoms, such as, methanol, ethanol, propanol, pentanol, octanol, 2-methoxyethanol, 2-ethoxyethanol, 2-butoxyethanol, glycerol, texanol, or terpineol, dihydric alcohol having 1 to 20 carbon atoms, such as, ethylene glycol, propylene glycol, hexanediol, octanediol, or pentanediol, or polyhydric alcohol may be used, but the present disclosure may not be limited thereto.

A type of binder may not be particularly limited, and may be selected based on a type of metal component or dispersant used in preparing the slurry.

For example, as the binder, alkyl cellulose having an alkyl group having 1 to 8 carbon atoms, such as methyl cellulose or ethyl cellulose, polyalkylene carbonate having an alkylene unit having 1 to 8 carbon atoms, such as polypropylene carbonate or polyethylene carbonate, or a polyvinyl alcohol-based binder, such as polyvinyl alcohol or polyvinyl acetate, may be used, but the present disclosure may not be limited thereto.

After forming the slurry to contain the metal powder, the dispersant, and the binder as above, the metal foam precursor may be formed by injecting the slurry into a mold having a predetermined shape or coating the slurry on a substrate.

The metal foam precursor thus formed may be formed into the porous member 320 through the sintering process.

In this case, conditions of the sintering process are not particularly limited as long as the sintering is performed at a temperature and for a time of levels at which a solvent contained in the slurry may be removed to a desired level. For example, the sintering may be performed in a temperature range of about 50° C. to 250° C. for a predetermined time, but the present disclosure may not be limited thereto.

The cushion plate 300 may be formed by attaching the adhesive member 310 to one surface of the porous member 320 after forming the porous member 320.

Alternatively, the cushion plate 300 including the porous member 320 may be formed by forming the metal foam precursor on the adhesive member 310 and sintering the metal foam precursor. The manufacturing method of the cushion plate 300 is not particularly limited.

The adhesive member 310 may have a predetermined thickness on one surface of the porous member 320.

The adhesive member 310 may contain an adhesive component, and the porous member 320 may be fixed to the first plate 210.

The adhesive member 310 may be made of or contain the material such as the optical clear adhesive (OCA), the optical clear resin (OCR), or the pressure sensitive adhesive (PSA).

The metal coating layer 330 having a predetermined thickness may be formed on the other surface opposite to one surface of the porous member 320 on which the adhesive member 310 is disposed.

The second connecting member 400 and the second plate 220 may be disposed beneath the cushion plate 300.

The second connecting member 400 may be disposed between the cushion plate 300 and the pad PAD.

When the display panel 100 is bent at the bendable portion BND such that the pad PAD of the display panel 100 is disposed below the front surface FP of the display panel 100, a restoring force to restore the display panel 100 to the state before bending may be applied strong.

When the restoring force is strongly applied, a lifting phenomenon in which the pad PAD of the bent display panel 100 is not fixed and is lifted may occur.

The second connecting member 400 may function as a fixing member for fixing the bent display panel 100 to maintain the bent shape.

The second connecting member 400 may be formed to have a constant thickness in a thickness direction to constantly maintain a curvature of the bendable portion BND.

The second connecting member 400 may be a double-sided tape having an adhesive force that may fix the second plate 220 and the metal coating layer 330, but the present disclosure may not be limited thereto.

Alternatively, the second connecting member 400 may be formed as a foam tape or a foam pad having the adhesive force to further have an effect of alleviating the impact.

The second plate 220 may be disposed beneath the second connecting member 400.

In order to dispose the second plate 220, the second plate 220 may be attached to a bottom surface of the pad PAD first, then the bendable portion BND may be bent, and then, the second plate 220 may be attached and fixed to the bottom surface of the second connecting member 400.

In the state in which the second plate 220 is fixed to the second connecting member 400, the second plate 220 may have a structure of being disposed on the pad PAD.

For example, the second connecting member 400 and the second plate 220 may be disposed between the metal coating layer 330 of the cushion plate 300 and the pad PAD.

In the state in which the second plate 220 is fixed to the second connecting member 400, an outer portion, which is a top surface, of the bendable portion BND may be exposed to the outside and a bottom surface, which is an inner portion, of the bendable portion BND may be disposed to side surfaces of the cushion plate 300 and the second connecting member 400.

A reinforcing member 600 may be disposed on the top surface, which is the outer portion, of the bendable portion BND of the display panel 100.

The reinforcing member 600 may cover the bendable portion BND, and may extend to cover at least a portion of each of the front surface FP and the pad PAD.

The reinforcing member 600 may contain a resin. For example, the reinforcing member 600 may contain an ultraviolet (UV) curable acrylic resin, but the present disclosure may not be limited thereto.

Because the reinforcing member 600 may cover the various signal wirings disposed between the encapsulation portion 130 of the display panel 100 and the pad PAD, the reinforcing member 600 may prevent moisture from penetrating into the signal wirings while protecting the signal wirings from external impact.

Because other components except the display substrate 110 and the signal wirings may be omitted in the bendable portion BND to increase the flexibility of the display panel 100, the reinforcing member 600 may complement the rigidity of the bendable portion BND in which other components are omitted.

In one example, a driver circuit 160 may be disposed on the other surface opposite to one surface on which the second plate 220 is disposed of the pad PAD of the display panel 100.

The driver circuit 160 may be disposed in a form of a chip on plastic (COP) mounted on the display substrate 110, but the present disclosure may not be limited thereto.

The driver circuit 160 may generate a data signal and a gate control signal based on image data and a timing synchronization signal supplied from an external host driving system.

The driver circuit 160 may supply the data signal to a data line of each pixel via a display pad, and may supply the gate control signal to a gate driver circuit.

The driver circuit 160 may be mounted in a chip mounting area defined on the display substrate 110 to be electrically connected to the display pad, and may be connected to each of the gate driver circuit and the signal line of the pixel array 120 disposed on the display substrate 110.

The display pad may be disposed on a distal end of the display substrate 110 on which the driver circuit 160 is mounted.

The display pad may be electrically connected to a flexible circuit board 500 on which a circuit board is mounted at a location on one surface of the display substrate 110.

The flexible circuit board 500 may be electrically connected to the display pad disposed at the distal end of the display substrate 110 by a film attachment process mediated by a conductive adhesive layer, and may be disposed on the back surface of the display panel 100.

As the conductive adhesive layer, an anisotropic conductive film (ACF) may be used as an example.

The circuit board may provide the image data and the timing synchronization signal supplied from the host driving system to the driver circuit 160, and may provide a voltage required to drive each of the pixel array 120, the gate driver circuit, and the driver circuit 160.

Hereinafter, with reference to FIGS. 4 to 6, various embodiments of the display apparatus including the through-hole according to an embodiment of the present disclosure will be described.

Figure 4:
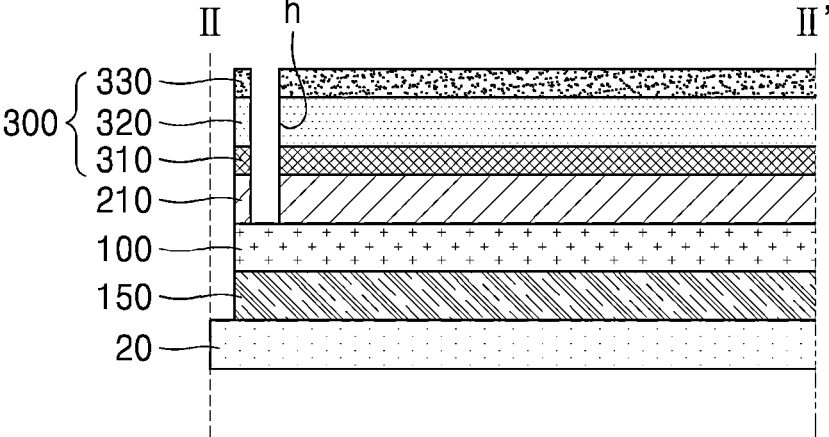
FIGS. 4 to 6 are cross-sectional views of a display apparatus including a through-hole according to various embodiments of the present disclosure.
Figure 4:
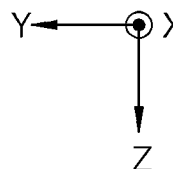

Referring to FIG. 4, the display apparatus 1 may include the cover member 20, the display panel 100 disposed on the back surface of the cover member 20, the cushion plate 300 disposed on the back surface of the display panel 100, and the through-hole h extending through the cushion plate 300.

Figure 5:
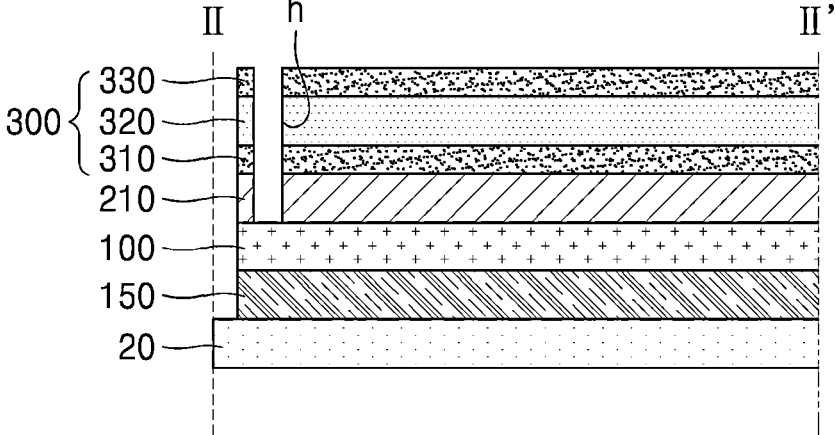
Figure 5:
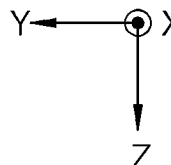
Figure 6:
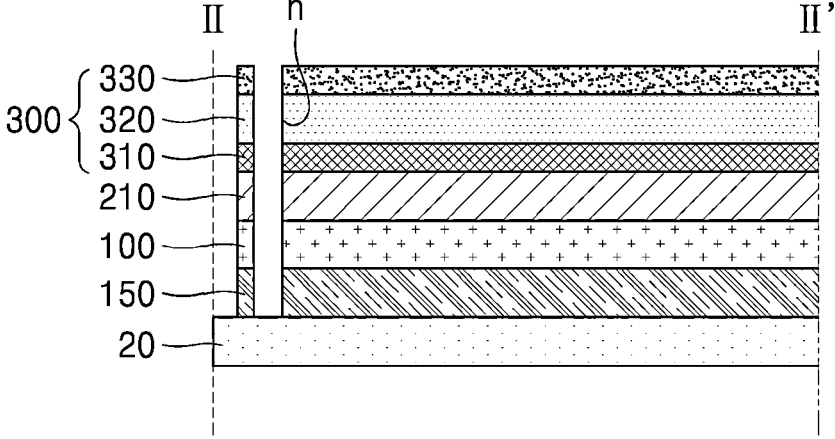
Figure 6:
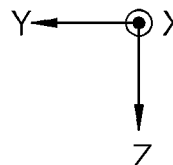

In FIGS. 4 to 6, the direction of the back surface may mean the −Z-axis direction.

Because the through-hole h extends through the cushion plate 300, a portion of the cushion plate 300 may be removed in an area corresponding to the through-hole.

Further, the first plate 210 may be included between the display panel 100 and the cushion plate 300, and the through-hole h may extend through the first plate 210.

Because the through-hole h extends through the first plate 210, a portion of the first plate 210 in an area corresponding to the through-hole may be removed.

Accordingly, in the area corresponding to the through-hole h, a portion of the display panel 100 may be exposed to the outside in the direction of the back surface.

Various recognition sensor modules, such as a fingerprint recognition sensor module, an infrared sensor module, and the like may be inserted into the through-hole h through which the portion of the display panel 100 is exposed.

The cushion plate 300 may include the porous member 320 and the metal coating layer 330 disposed on the back surface of the porous member 320.

The metal coating layer 330 may contain nickel (Ni), and may be formed to have a thickness in a range from 0.2 μm to 0.5 μm.

As described above, the metal coating layer 330 containing the nickel and having a thickness in the range from 0.2 μm to 0.5 μm may be implemented in the gray-based color.

Therefore, referring to the rear view with the casing 40 of the display apparatus 1 removed as shown in in FIG. 1B, the cushion plate 300 may be implemented as the monochromatic layer of the gray-based color as the metal coating layer 330 that is implemented in the gray-based color is exposed in the direction of the back surface.

As such, in the display apparatus according to an embodiment of the present disclosure, the cushion plate 300 includes the porous member 320 and the monochromatic metal coating layer 330 having the gray-based color, and the monochromatic cushion plate 300 having the gray-based color is disposed to correspond to the entire area of the display area AA, so that the luminous reflectance on the front surface of the display apparatus 1 may be improved to greatly improve the front surface visibility.

The cushion plate 300 including the metal coating layer 330 having the gray-based color may have values in a* color coordinates in a range from 1.5 to 2.0 and in b* color coordinates in a range from 5.8 to 6.4.

FIG. 7 is a table summarizing result values obtained by measuring L*, a*, b* color coordinates of the metal coating layer 330 having the gray-based color according to first to sixth Examples of the present disclosure.

A reflected color of a surface layer of the metal coating layer was measured using CM2600D equipment of Minolta, and reflected color values of the CIE 1976 L*, a*, b* color coordinates under a D65 light source condition were obtained.

Light that is incident on a surface of an object and is reflected at the same angle is referred to as specularly reflected light, and light that is not specularly reflected but is scattered and reflected in various directions is referred to as diffusion-reflected light.

A color measurement method for measuring a color of light excluding the specularly reflected light is referred to as a specular component excluded (SCE) method, and a color measurement method for measuring a color of light including the specularly reflected light is referred to as a specular component included (SCI) method.

As may be identified from a* color coordinates and b* color coordinates of the SCI and the SCE disclosed in FIG. 7, it may be identified that the metal coating layer 330 having the gray-based color according to Example of the present disclosure has the values in the a* color coordinates in the range from 1.5 to 2.0 and in the b* color coordinates in the range from 5.8 to 6.4.

Figure 8A:
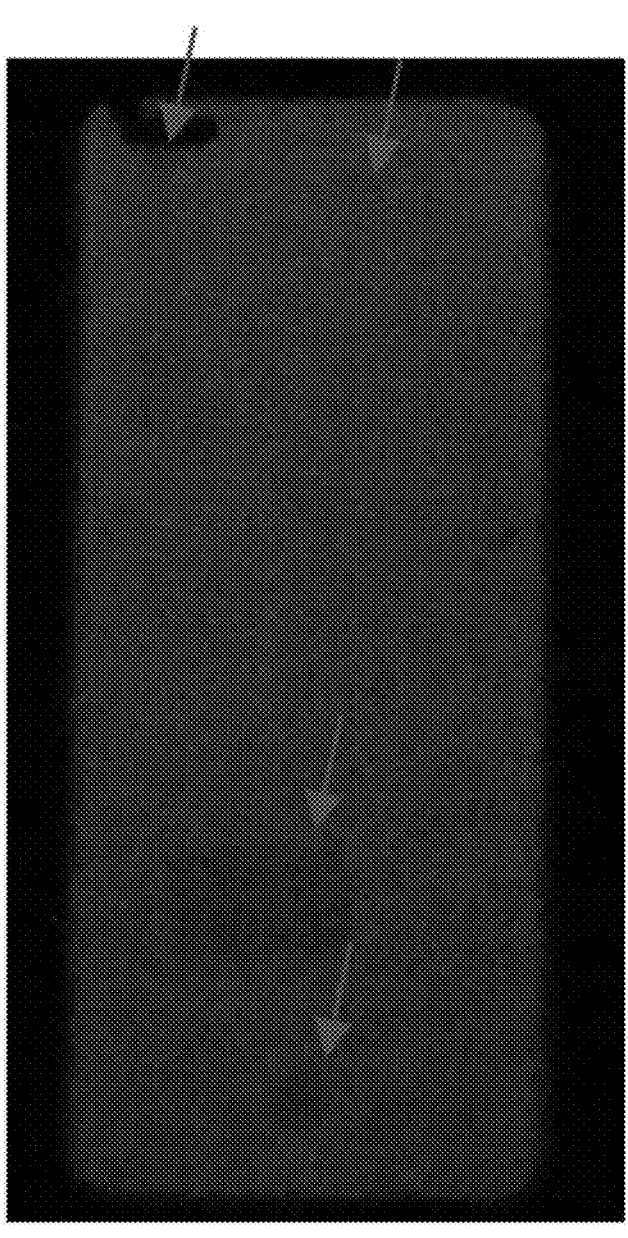
FIGS. 8A and 8B are views of Comparative Examples in which a mura phenomenon in which black spots and white spots are formed in an area where a through-hole is defined, respectively.
Figure 8B:

FIGS. 8A and 8B are views of Comparative Examples in which a mura phenomenon in which black spots and white spots are formed in an area where the through-hole h is defined, respectively.

When the through-hole h is defined as such, a high-gradation mura phenomenon in which the hole appears dark on a bright screen or a low-gradation mura phenomenon in which the hole appears bright on a dark screen may occur centered on the area of the through-hole h.

For example, when the metal coating layer 330 has a value in the a* color coordinates smaller than 1.5 or a value in the b* color coordinates smaller than 5.8, the metal coating layer 330 may become darker than the gray color according to an embodiment of the present disclosure.

Figure 9A:
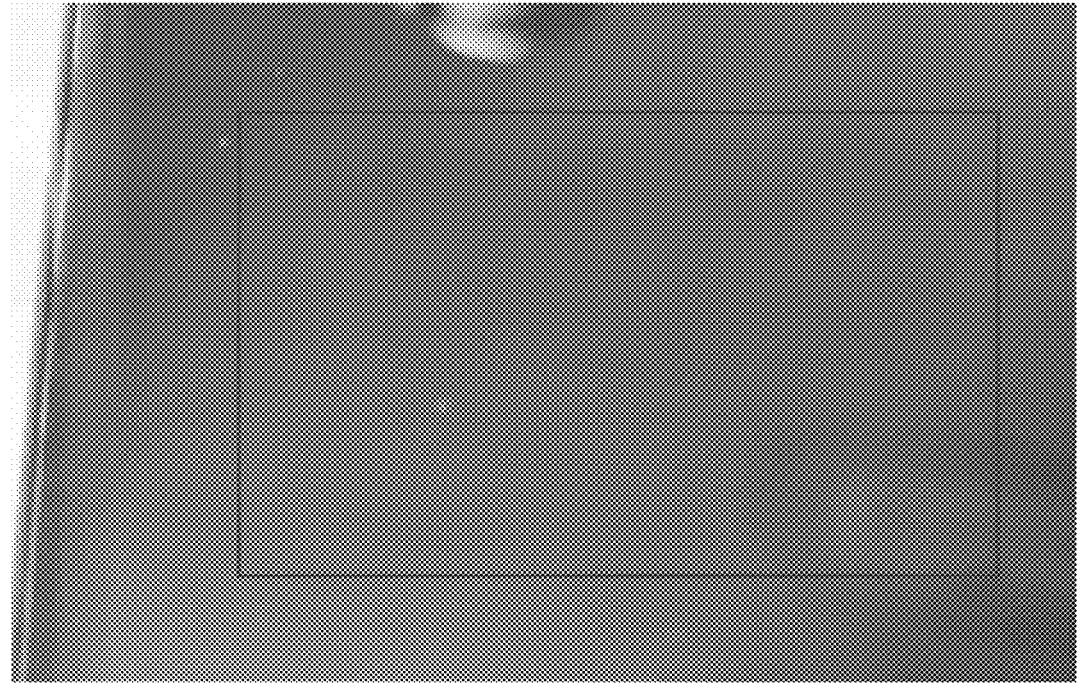
FIGS. 9A and 9B are views showing a hole change phenomenon in high-gradation and low-gradation of a metal coating layer according to Comparative Example.
Figure 9B:
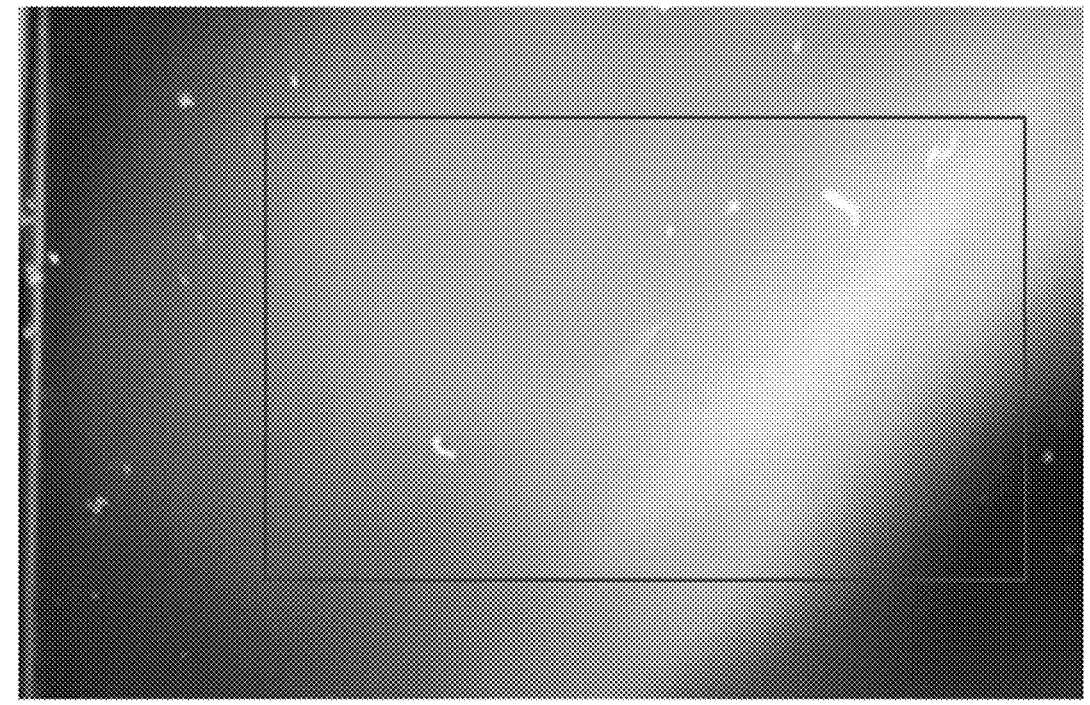

In this case, a phenomenon of gradually darkening in the high-gradation as shown in FIG. 9A and gradually brightening in the low-gradation as shown in FIG. 9B may be identified, so that a hole change phenomenon based on color coordinate characteristics may be identified through the drawings.

Accordingly, a difference in the luminous reflectance between the area in which the through-hole is defined and the area in which the through-hole is not defined may increase.

Further, when the metal coating layer 330 has a value in the a* color coordinates greater than 2.0 or a value in the b* color coordinates greater than 6.4, the metal coating layer 330 may become brighter than the gray color according to an embodiment of the present disclosure.

Figure 10A:
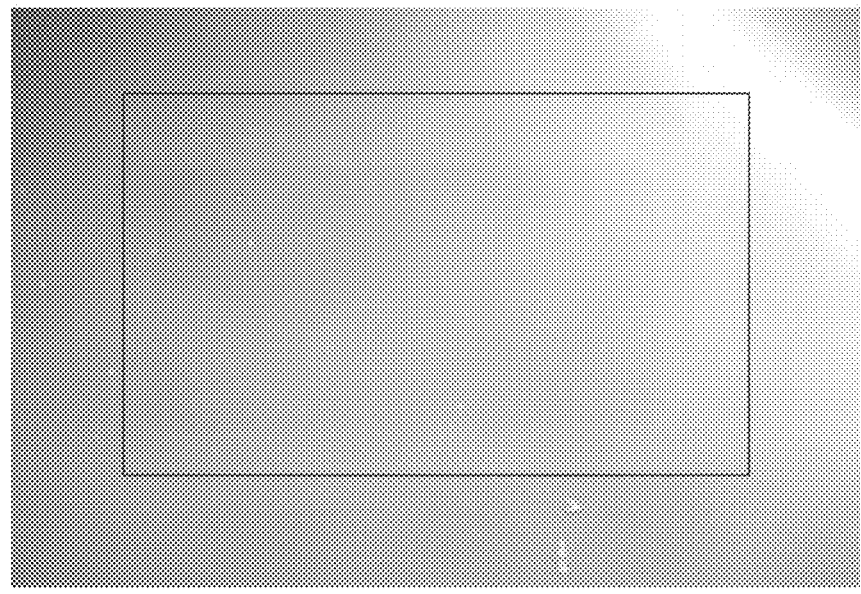
FIGS. 10A and 10B are views showing a hole change phenomenon in high-gradation and low-gradation of a metal coating layer according to Comparative Example.
Figure 10B:
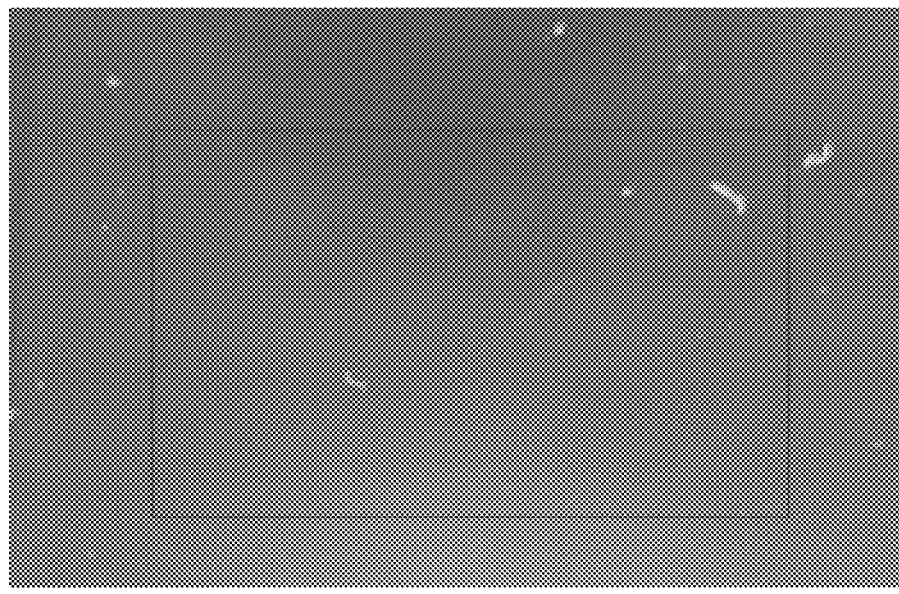

In this case, a phenomenon of gradually brightening in the high-gradation as shown in FIG. 10A and gradually darkening in the low-gradation as shown in FIG. 10B may be identified, so that the hole change phenomenon based on the color coordinate characteristics may be identified through the drawings.

Accordingly, the difference in the luminous reflectance between the area in which the through-hole is defined and the area in which the through-hole is not defined may increase.

As described above, the through-hole h of the display apparatus 1 according to an embodiment of the present disclosure may be disposed within the display area AA of the display panel 100.

When the area in which the through-hole h that causes the mura phenomenon is defined is exposed to the light, a leakage current may rise, which may cause a threshold voltage (Vth) to be shifted in a + direction to induce the change in the element.

Accordingly, the cushion plate 300 according to an embodiment of the present disclosure includes the metal coating layer 330 that contains the nickel and has the thickness in the range from 0.2 μm to 0.5 μm to be implemented in the gray-based color, thereby greatly reducing the occurrence of the mura phenomenon.

By the cushion plate 300 including the metal coating layer 330 implemented in the gray-based color, the difference in the luminous reflectance between the area other than the through-hole h and the area of the through-hole h may be greatly reduced, so that the occurrence of the mura phenomenon in the vicinity of the through-hole h may be greatly reduced.

The display apparatus 1 according to an embodiment described with reference to FIG. 5 will be described focusing on differences from the display apparatus 1 described with reference to FIG. 4, and common contents will be omitted.

The adhesive member 310 may be disposed on the other surface of the porous member 320 opposite to one surface on which the metal coating layer 330 is disposed.

In this case, the adhesive member 310 may be formed to realize the gray-based color.

A method for implementing the adhesive member 310 in the gray-based color may not be particularly limited. For example, the gray-based color may be realized by mixing a black resin and a white resin with each other.

As such, because not only the metal coating layer 330 but also the adhesive member 310 is formed to realize the gray-based color, the cushion plate 300 according to an embodiment of the present disclosure may greatly reduce the difference in the luminous reflectance between the area other than the through-hole h and the area of the through-hole h to significantly reduce the occurrence of the mura phenomenon in the vicinity of through-hole h.

The display apparatus 1 according to an embodiment described with reference to FIG. 6 will be described focusing on differences from the display apparatus 1 described with reference to FIG. 4, and common contents will be omitted.

The first plate 210 may be included between the display panel 100 and the cushion plate 300, and the through-hole h may extend through the first plate 210.

Further, the first connecting member 150 may be included between the display panel 100 and the cover member 20, and the through-hole h may extend through the display panel 100 and the first connecting member 150.

Therefore, the through-hole h may extend through the cushion plate 300, the first plate 210, the display panel 100, and the first connecting member 150, and a portion of the cover member 20 corresponding to the through-hole h may be exposed to the outside in the back surface direction.

A camera module may be inserted into the through-hole h where the portion of each of the cushion plate 300, the first plate 210, the display panel 100, and the first connecting member 150 is removed as such.

Accordingly, according to an embodiment of the present disclosure, by the cushion plate 300 including the metal coating layer 330 implemented in the gray-based color, the difference in the luminous reflectance between the area other than the through-hole h and the area of the through-hole h may be greatly reduced, so that the occurrence of the mura phenomenon in the vicinity of the through-hole h may be greatly reduced.

An aspect of the present disclosure provides a display apparatus including a cover member, a display panel disposed on a back surface of the cover member, a cushion plate disposed on a back surface of the display panel, and a through-hole extending through the cushion plate, wherein the cushion plate includes a porous member and a metal coating layer disposed on a back surface of the porous member, wherein the metal coating layer contains nickel (Ni) and has a thickness in a range from 0.2 μm to 0.5 μm.

In one implementation, the porous member contains a conductive metal and a plurality of pores disposed inside the conductive metal.

In one implementation, the metal coating layer has a value in a* color coordinates in a range from 1.5 to 2.0 and in b* color coordinates in a range from 5.8 to 6.4.

In one implementation, the metal coating layer has a gray-based color.

In one implementation, the cushion plate further includes an adhesive member, the adhesive member is disposed between the porous member and the display panel, and the adhesive member has a gray-based color.

In one implementation, the display panel includes a display area and a non-display area, and the through-hole is disposed within the display area.

In one implementation, the cushion plate is disposed to correspond to the display area.

In one implementation, the display apparatus further includes a first plate disposed between the display panel and the cushion plate, and the through-hole extends through the first plate.

In one implementation, the display apparatus further includes a first connecting member disposed between the display panel and the cover member, and the through-hole extends through the display panel and the first connecting member.

In one implementation, a sensor module or a camera module is inserted into the through-hole.

A scope of protection of the present disclosure should be construed by the scope of the claims, and all technical ideas within the scope equivalent thereto should be construed as being included in the scope of the present disclosure. Although the embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure. The scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. A display apparatus comprising:
   a cover member;
   a display panel disposed under the cover member;
   a cushion plate disposed under the display panel; and
   a through-hole extending through the cushion plate,
   wherein the cushion plate includes a porous member and
      a metal coating layer disposed on a back surface of the
      porous member,
   wherein the metal coating layer contains nickel (Ni) and
      has a thickness in a range from 0.2 μm to 0.5 μm,
   wherein the metal coating layer has a value in a* color
      coordinates in a range from 1.5 to 2.0 and in b* color
      coordinates in a range from 5.8 to 6.4, and
   wherein the metal coating layer has a gray-based color.

2. The display apparatus of claim 1, wherein the porous member contains a conductive metal and a plurality of pores disposed inside the conductive metal.

3. The display apparatus of claim 1, wherein the cushion plate further includes an adhesive member,
   wherein the adhesive member is disposed between the
      porous member and the display panel, and
   wherein the adhesive member has a gray-based color.

4. The display apparatus of claim 1, wherein the display panel includes a display area and a non-display area,
   wherein the through-hole is disposed within the display
      area.

5. The display apparatus of claim 4, wherein the cushion plate is disposed under the display area and overlaps with the display area.

6. The display apparatus of claim 1, further comprising a first plate disposed between the display panel and the cushion plate,
   wherein the through-hole extends through the first plate.

7. The display apparatus of claim 6, further comprising a first connecting member disposed between the display panel and the cover member,
   wherein the through-hole extends through the display
      panel and the first connecting member.

8. The display apparatus of claim 1, wherein a sensor module or a camera module is inserted into the through-hole.

9. A display apparatus comprising:
   a cover member;
   a first connecting member disposed under the cover
      member;
   a display panel disposed under the first connecting mem-
      ber;
   a first plate disposed under the display panel;
   a cushion plate disposed under the first plate; and
   a through-hole extending through the cushion plate, the
      first plate, the display panel and the first connecting
      member,
   wherein the cushion plate includes a porous member, a
      metal coating layer disposed on a back surface of the
      porous member and an adhesive member disposed
      between the porous member and the first plate,
   wherein the metal coating layer contains nickel and has a
      thickness in a range from 0.2 μm to 0.5 μm,
   wherein the metal coating layer and the adhesive member
      each has a gray-based color, and
   wherein the metal coating layer has a value in a* color
      coordinates in a range from 1.5 to 2.0 and in b* color
      coordinates in a range from 5.8 to 6.4.

10. The display apparatus of claim 9, wherein a sensor module or a camera module is inserted into the through-hole.

* * * * *